(12) United States Patent
Yoshimi et al.

(10) Patent No.: US 12,243,836 B2
(45) Date of Patent: Mar. 4, 2025

(54) SEMICONDUCTOR DEVICE

(71) Applicant: Murata Manufacturing Co., Ltd., Kyoto-fu (JP)

(72) Inventors: Shunji Yoshimi, Nagaokakyo (JP); Satoshi Goto, Nagaokakyo (JP); Mikiko Fukasawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 652 days.

(21) Appl. No.: 17/548,679

(22) Filed: Dec. 13, 2021

(65) Prior Publication Data

US 2022/0199557 A1 Jun. 23, 2022

(30) Foreign Application Priority Data

Dec. 18, 2020 (JP) ................................. 2020-210055

(51) Int. Cl.
| H03F 3/04 | (2006.01) |
| H01L 23/498 | (2006.01) |
| H01L 23/66 | (2006.01) |
| H01L 25/065 | (2023.01) |
| H03F 1/02 | (2006.01) |

(Continued)

(52) U.S. Cl.
CPC ........ *H01L 23/66* (2013.01); *H01L 23/49822* (2013.01); *H01L 25/0657* (2013.01); *H03F 1/0211* (2013.01); *H03F 3/19* (2013.01); *H01L 2223/6655* (2013.01);

(Continued)

(58) Field of Classification Search
CPC .............. H01L 23/66; H01L 23/49822; H01L 25/0657; H01L 2223/6655; H01L 2225/06517; H01L 24/13; H01L 24/14; H01L 29/20; H01L 29/66318; H01L 2223/6644; H01L 2223/6683; H01L 2224/1403; H01L 2224/14519; H01L 29/7371; H01L 27/0248; H01L 23/528; H03F 1/0211; H03F 3/19; H03F 1/56; H03F 2200/387; H03F 2200/451; H03F 2200/294; H03F 3/245; H03F 3/195; H03F 3/04; H03F 1/302; H03F 2200/18; H03F 1/301; H03F 1/26; H03F 3/72; H03F 1/0277; H03G 1/0088

See application file for complete search history.

(56) References Cited

U.S. PATENT DOCUMENTS 10,262,875 B2 * 4/2019 Kogure ................. H01L 21/50
10,972,593 B1 * 4/2021 Sawada ............... H04M 1/0277

(Continued)

FOREIGN PATENT DOCUMENTS

JP 2007-073812 A 3/2007

*Primary Examiner* — Khanh V Nguyen
(74) *Attorney, Agent, or Firm* — Studebaker & Brackett PC

(57) ABSTRACT

In a semiconductor device, a first member having a first surface includes a plurality of circuit blocks disposed in an inner region of the first surface when the first surface is viewed in plan. The second member is joined to the first surface of the first member in surface contact with the first surface. The second member includes a plurality of first transistors that are connected in parallel to each other and form a first amplifier circuit. A conductive protrusion protrudes from the second member on an opposite side to the first member. The first transistors are disposed in a region not overlapping any of the circuit blocks in the first member in a plan view.

20 Claims, 13 Drawing Sheets

(51) Int. Cl.
 *H03F 3/14* (2006.01)
 *H03F 3/19* (2006.01)
 *H03F 1/56* (2006.01)

(52) U.S. Cl.
 CPC ...... *H01L 2225/06517* (2013.01); *H03F 1/56* (2013.01); *H03F 2200/387* (2013.01); *H03F 2200/451* (2013.01)

(56) References Cited

U.S. PATENT DOCUMENTS

| | | |
|---|---|---|
| 2015/0200189 A1 | 7/2015 | Teeter et al. |
| 2015/0303971 A1* | 10/2015 | Reisner ................. H01L 29/737 330/307 |
| 2016/0072456 A1* | 3/2016 | Lin ........................ H03F 3/191 330/303 |
| 2020/0006536 A1* | 1/2020 | Sasaki ....................... H03F 3/19 |

* cited by examiner

SEMICONDUCTOR DEVICE

CROSS-REFERENCE TO RELATED APPLICATION

This application claims benefit of priority to Japanese Patent Application No. 2020-210055, filed Dec. 18, 2020, the entire content of which is incorporated herein by reference.

BACKGROUND

Technical Field

The present disclosure relates to a semiconductor device.

Background Art

Radio-frequency (RF) front-end modules with integrated functions of transmitting and receiving radio-frequency signals are installed in electronic devices for communications such as mobile communications and satellite communications. An RF front-end module includes, for example, a monolithic microwave integrated circuit (MMIC) with a function of amplifying radio-frequency signals, a control integrated circuit (IC) for controlling a radio-frequency amplifier circuit, a switch IC, and a duplexer.

U.S. Patent Application Publication No. 2015/0303971 discloses a radio-frequency module that is miniaturized by stacking a control IC on an MMIC. The radio-frequency module disclosed in U.S. Patent Application Publication No. 2015/0303971 includes the MMIC mounted on a module substrate and the control IC stacked on the MMIC. Electrodes of the MMIC, electrodes of the control IC, and electrodes on the module substrate are electrically connected to each other by wire bonding.

SUMMARY

For example, a heterojunction bipolar transistor (HBT) is utilized in a radio-frequency amplifier circuit. During operation of an HBT, the HBT generates heat because collector dissipation occurs. A temperature rise of the HBT caused by heat generation in turn increases a collector current. When conditions for this positive feedback are satisfied, thermal runaway occurs in the HBT. To avoid the thermal runaway in the HBT, an upper limit of output power of the HBT is restricted.

To increase a power output of the radio-frequency amplifier circuit, it is desirable to improve the characteristics of heat dissipation from a semiconductor device including an HBT and so on. The radio-frequency module disclosed in U.S. Patent Application Publication No. 2015/0303971 is difficult to satisfy a recent demand for radio-frequency amplifier circuits with high power outputs.

Accordingly, the present disclosure provides a semiconductor device that can improve the characteristics of heat dissipation.

According to one aspect of the present disclosure, a semiconductor device includes a first member having a first surface and including a plurality of circuit blocks disposed in an inner region of the first surface when the first surface is viewed in plan, and a second member joined to the first surface of the first member in surface contact with the first surface. The second member includes a plurality of first transistors that are connected in parallel to each other and form a first amplifier circuit. The semiconductor device further includes a conductive protrusion protruding from the second member on an opposite side to the first member. The first transistors are disposed in a region not overlapping any of the circuit blocks in the first member in a plan view.

Heat generated from the first transistors is transferred through two heat transfer paths, namely a heat transfer path extending from the first transistors to the first member and a transfer path through the conductive protrusion. As a result, the characteristics of heat dissipation from the first transistors can be improved.

DETAILED DESCRIPTION

First Embodiment

A semiconductor device according to a first embodiment will be described below with reference to FIGS. 1 to 7D. The semiconductor device according to the first embodiment described below is a radio-frequency power amplifier.

Figure 1:
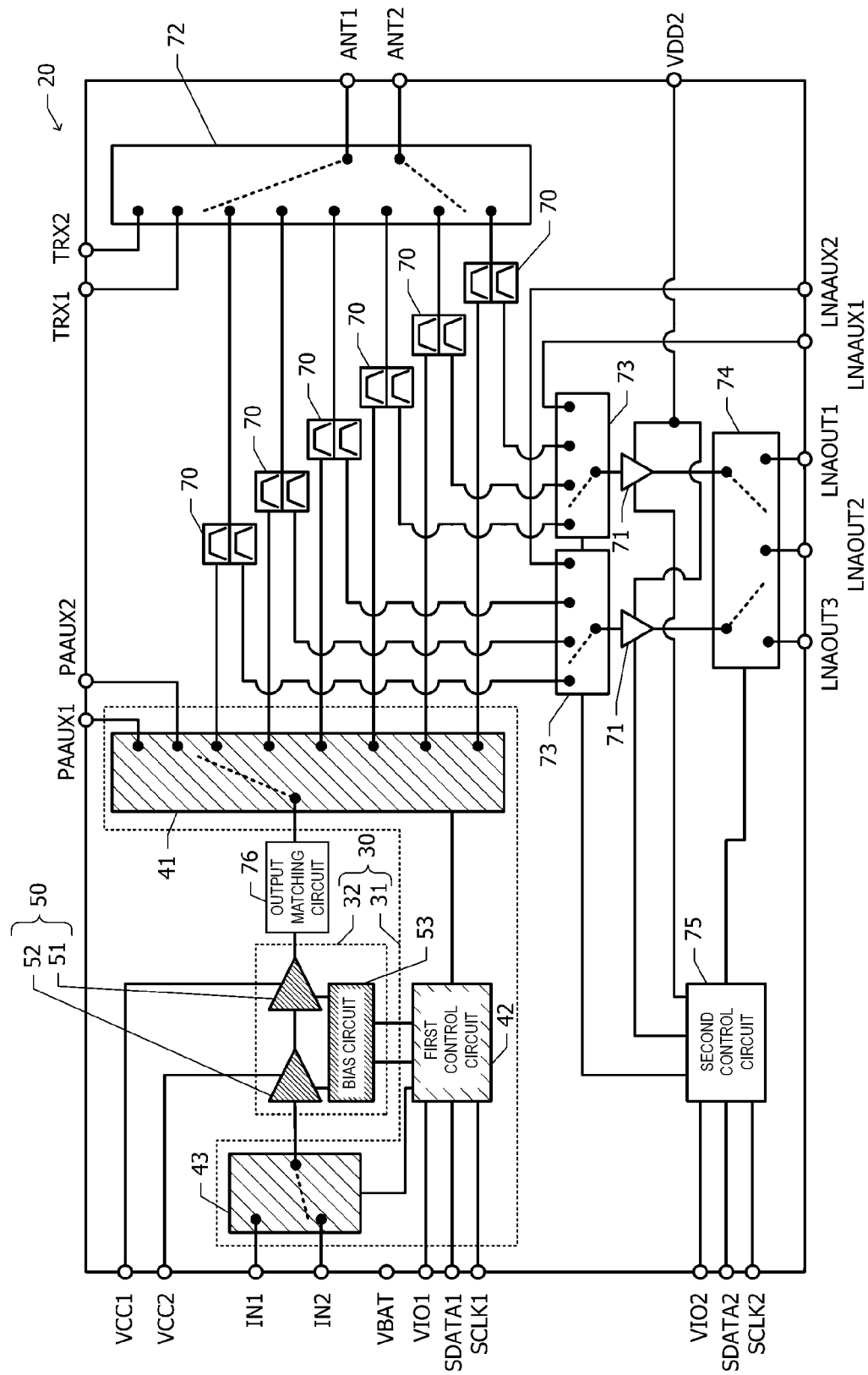
FIG. 1 is a block diagram of a radio-frequency module including a semiconductor device according to a first embodiment.

FIG. 1 is a block diagram of a radio-frequency module 20 including the semiconductor device according to the first embodiment. The radio-frequency module 20 includes the semiconductor device 30 according to the first embodiment, an output matching circuit 76, a plurality of duplexers 70, an antenna switch 72, two band selection switches 73 for reception, two low-noise amplifiers 71, an output terminal selection switch 74 for reception, and a second control circuit 75. Those circuit components are flip-chip mounted on a module substrate. The radio-frequency module 20 has a function of transmitting and receiving signals in accordance with a frequency division duplex (FDD) system.

The semiconductor device 30 includes a first member 31 and a second member 32 joined to the first member 31. For example, the first member 31 is made of an elemental semiconductor, and the second member 32 is made of a compound semiconductor. An input switch 43, a first control circuit 42, and a band selection switch 41 are formed in the first member 31. A two-stage radio-frequency amplifier circuit 50 made up of a first amplifier circuit 51 and a second amplifier circuit 52, and a bias circuit 53 are formed in the second member 32. The second amplifier circuit 52 is an amplifier circuit in a first stage, and the first amplifier circuit 51 is an amplifier circuit in a final stage. In FIG. 1, circuit blocks disposed in the first member 31 are denoted by relatively light hatching, and circuit blocks disposed in the second member 32 are denoted by relatively dark hatching. The bias circuit 53 supplies bias currents to the first amplifier circuit 51 and the second amplifier circuit 52 in accordance with control signals from the first control circuit 42.

Two input contacts of the input switch 43 are connected in one-to-one relation to radio-frequency signal input terminals IN1 and IN2 disposed on or in the module substrate. Radio-frequency signals are input through the two radio-frequency signal input terminals IN1 and IN2. The input switch 43 selects one of the two input contacts and causes the radio-frequency signal input to the selected contact to be input to the radio-frequency amplifier circuit 50.

The radio-frequency signal amplified by the radio-frequency amplifier circuit 50 is input to one input contact of the band selection switch 41 after passing through the output matching circuit 76. The band selection switch 41 selects one from a plurality of output contacts and causes the radio-frequency signal amplified by the radio-frequency amplifier circuit 50 to be output from the selected output contact.

Two of the output contacts of the band selection switch 41 are connected in one-to-one relation to auxiliary output terminals PAAUX1 and PAAUX2 disposed on or in the module substrate. The other six output contacts are connected to input ports for transmission of the duplexers 70 that are prepared individually for each of bands. The band selection switch 41 has a function of selecting one from the duplexers 70 prepared individually for each of bands.

The antenna switch 72 includes a plurality of circuit-side contacts and two antenna-side contacts. Two of the circuit-side contacts of the antenna switch 72 are connected to transmitted-signal input terminals TRX1 and TRX2 in one-to-one relation. The other six circuit-side contacts are connected to input-output common ports of the duplexers 70 in one-to-one relation. The two antenna-side contacts are connected to antenna terminals ANT1 and ANT2 in one-to-one relation. An antenna is connected to each of the antenna terminals ANT1 and ANT2.

The antenna switch 72 connects the two antenna-side contacts to two selected from the circuit-side contacts in one-to-one relation. When a single band is used for communication, the antenna switch 72 connects one circuit-side contact and one antenna-side contact. A radio-frequency signal amplified by the radio-frequency amplifier circuit 50 and passed through one duplexer 70 for the corresponding band is transmitted from the antenna connected to the selected antenna-side contact.

The two band selection switches 73 for reception each include four input contacts and one output contact. Three of the four input contacts in each of the two band selection switches 73 are connected to output ports for reception of the duplexers 70 in one-to-one relation. The remaining one input contact in each of the two band selection switches 73 is connected to an auxiliary input terminal LNAAUX1 or LNAAUX2.

The output contacts of the two band selection switches 73 for reception are connected to the two low-noise amplifiers 71 in one-to-one relation. The two band selection switches 73 for reception each cause a received signal after passing through the duplexer 70 to be input to the corresponding low-noise amplifier 71.

Two circuit-side contacts of the output terminal selection switch 74 are connected to output ports of the two low-noise amplifiers 71 in one-to-one relation. Three terminal-side contacts of the output terminal selection switch 74 are connected to received-signal output terminals LNAOUT1, LNAOUT2, and LNAOUT3 in one-to-one relation. A received signal amplified by the low-noise amplifier 71 is output from the received-signal output terminal selected by the output terminal selection switch 74.

Supply voltages are applied to the first amplifier circuit 51 and the second amplifier circuit 52 from power supply terminals VCC1 and VCC2, respectively, disposed on or in the module substrate.

The first control circuit 42 is connected to a power supply terminal VIO1, a control signal terminal SDATA1, and a clock terminal SCLK1. The first control circuit 42 controls the bias circuit 53, the input switch 43, and the band selection switch 41 in accordance with control signals applied to the control signal terminal SDATA1.

The second control circuit 75 is connected to a power supply terminal VIO2, a control signal terminal SDATA2, and a clock terminal SCLK2. The second control circuit 75 controls the low-noise amplifiers 71, the band selection switch 73 for reception, and the output terminal selection switch 74 in accordance with control signals applied to the control signal terminal SDATA2.

A power supply terminal VBAT and a drain voltage terminal VDD2 are further disposed on or in the module substrate. Supply power is applied from the power supply terminal VBAT to the bias circuit for the radio-frequency amplifier circuit 50 and to the first control circuit 42. A supply voltage is applied from the drain voltage terminal VDD2 to each of the low-noise amplifiers 71.

Figure 2:
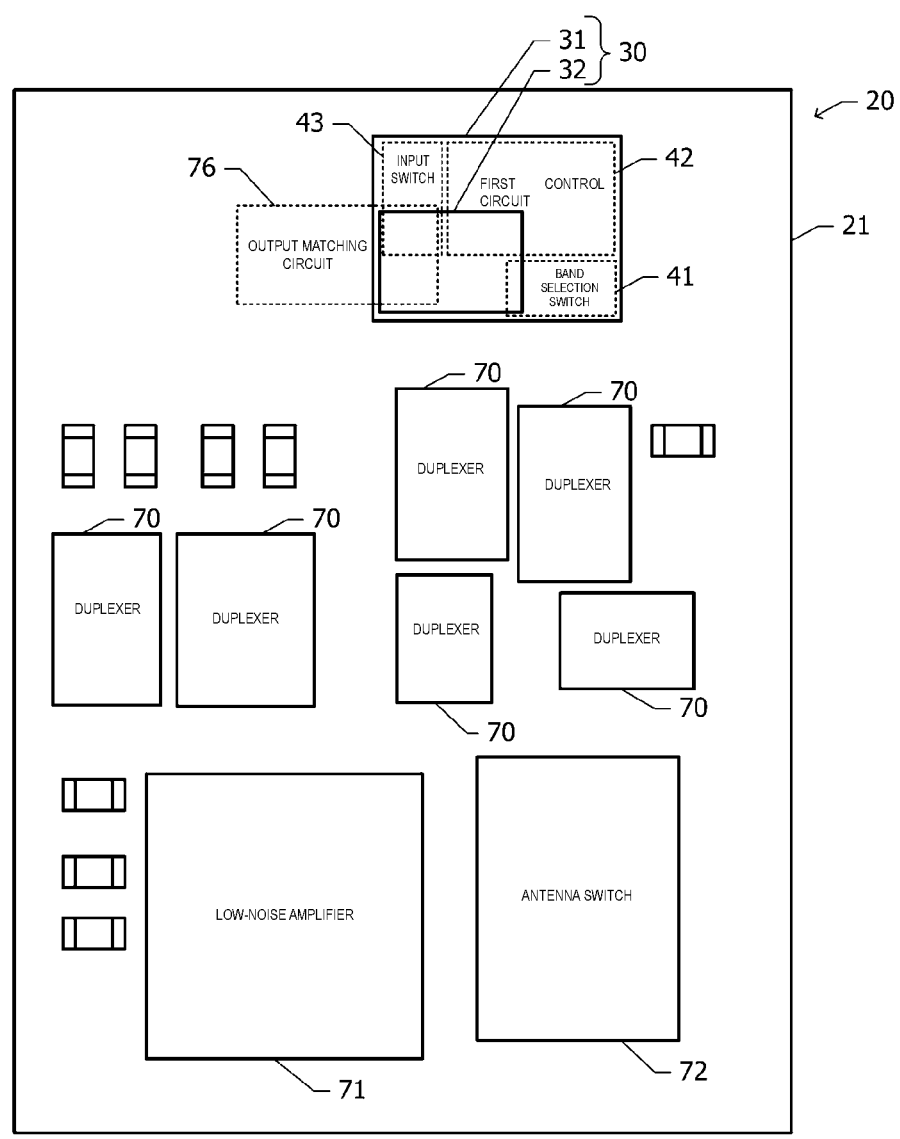
FIG. 2 illustrates a positional relation in a plan view among circuit components of the radio-frequency module according to the first embodiment.

FIG. 2 illustrates a positional relation in a plan view among circuit components of the radio-frequency module 20 according to the first embodiment. The semiconductor device 30, the duplexers 70, the low-noise amplifiers 71, the antenna switch 72, and a plurality of other surface-mounted passive components are mounted on or in the module substrate 21. The first member 31 of the semiconductor device 30 has a larger size than the second member 32 and encompasses the second member 32 in a plan view.

The band selection switch 41, the first control circuit 42, and the input switch 43 are formed in the first member 31. In FIG. 2, regions where circuit blocks constituting, for example, the band selection switch 41, the first control circuit 42, and the input switch 43 are disposed are denoted by surrounding dashed lines. Here, the circuit block represents an assembly of a plurality of circuit elements, such as semiconductor elements and passive elements, constituted to realize a certain function, and of wirings connecting the circuit elements to each other. Generally, circuit design is performed for each of the circuit blocks, and the circuit blocks are laid out on a semiconductor substrate per block.

The output matching circuit 76 is constituted by passive elements, such as inductors, disposed in the module substrate, capacitors surface-mounted on the module substrate, and so on. The inductors forming the output matching circuit 76 are disposed at positions overlapping the semiconductor device 30 in a plan view. In this Specification, the state in which "two members overlap in a plan view" includes a state in which one member encompasses the other member, a state in which part of one member overlaps part of the other member, and a state in which outer peripheral lines of two members match with each other.

Figure 3:
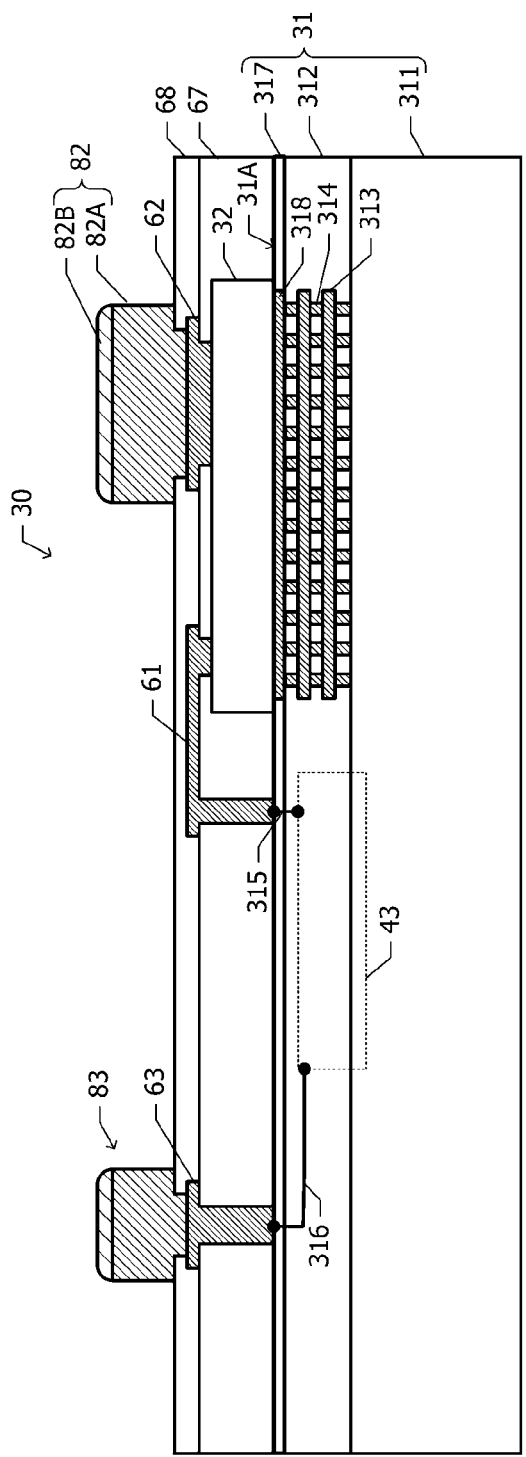
FIG. 3 is a schematic sectional view of the semiconductor device according to the first embodiment.

FIG. 3 is a schematic sectional view of the semiconductor device 30 according to the first embodiment. The first member 31 includes a substrate 311, a multilayer wiring structure 312 disposed on the substrate 311, and a first-member protection film 317 covering a surface of the multilayer wiring structure 312. The substrate 311 includes a semiconductor portion made of an elemental semiconductor. For example, a silicon substrate or a silicon-on-insulator (SOI) substrate is used as the substrate 311. The band selection switch 41 (FIG. 1), the first control circuit 42 (FIG. 1), and the input switch 43 (FIG. 1) are constituted by semiconductor elements formed in a surface layer portion of the substrate 311 and by wirings in the multilayer wiring structure 312. In FIG. 3, a region where the input switch 43 is formed is denoted by a surrounding dashed line. An outermost surface of the first member 31 is called here a first surface 31A. An opening is formed in part of the first-member protection film 317, and a metal film 318 is filled in the opening. Upper surfaces of the first-member protection film 317 and the metal film 318 correspond to the first surface 31A.

The second member 32 is joined to the first surface 31A of the first member 31 in surface-contact with the first surface 31A. Furthermore, at least part of the second member 32 overlaps at least part of the metal film 318 in a plan view, and the second member 32 is in surface-contact with the metal film 318. An interlayer insulating film 67 is disposed on the first surface 31A to cover the second member 32. A plurality of openings are formed in the interlayer insulating film 67 at predetermined positions. Pads 62 and 63 and a wiring 61 are disposed on the interlayer insulating film 67. A wiring layer in which the pads 62 and 63 and the wiring 61 are disposed is called a redistribution layer in some cases. The wiring 61 in the redistribution layer is called a rewiring line or a redistribution line in some cases.

The wiring 61 passes through the opening formed in the interlayer insulating film 67 and connects a circuit formed in the second member 32 and a circuit formed in the first member 31. For example, the wiring 61 is connected to the input switch 43 via a wiring 315 in the multilayer wiring structure 312. For example, the wiring 61 is used for connection between the input switch 43 and the second amplifier circuit 52 illustrated in FIG. 1, between the first control circuit 42 and the second amplifier circuit 52, or between the first control circuit 42 and the first amplifier circuit 51.

The pad 62 is encompassed within the second member 32 in a plan view and is connected to the circuit formed in the second member 32. The other pad 63 is disposed outside the second member 32 in a plan view and is connected to the input switch 43 formed in the first member 31 via a wiring 316 in the multilayer wiring structure 312.

A protection film 68 is disposed on the interlayer insulating film 67 to cover the redistribution layer. Openings are formed in the protection film 68 to make partial regions of upper surfaces of the pads 62 and 63 exposed. Conductive protrusions 82 and 83 are disposed respectively on the pads 62 and 63. The conductive protrusion 82 includes a Cu pillar 82A connected to the pad 62 and a solder layer 82B disposed on an upper surface of the Cu pillar 82A. The conductive protrusion 82 with such a structure is called a Cu pillar bump.

An under bump metal layer may be disposed on a bottom surface of the Cu pillar 82A with intent to improve adhesion of the Cu pillar. The other conductive protrusion 83 also has the same multilayer structure as the conductive protrusion 82. Instead of the Cu pillar bump, for example, an Au bump, a solder ball bump, or a conductive column erected on the pad may also be used as the conductive protrusions 82 and 83 and so on. A bump without including a solder layer, like an Au bump, is also called a pillar. The conductive column erected on the pad is also called a post.

The conductive protrusion 82 is used for connection, for example, between the power supply terminal VCC1 and the first amplifier circuit 51 illustrated in FIG. 1, between the power supply terminal VCC2 and the second amplifier circuit 52, or between the first amplifier circuit 51 and the output matching circuit 76. The conductive protrusion 82 is further used for connection between a ground conductor in the second member 32 and a ground conductor in or on the module substrate.

The conductive protrusion 83 is used for connection, for example, between the input switch 43 and each of the radio-frequency signal input terminals IN1 and IN2 illustrated in FIG. 1, between the first control circuit 42 and each of the power supply terminal VIO1, the control signal terminal SDATA1, and the clock terminal SCLK1, or between the band selection switch 41 and each of the output matching circuit 76, the duplexers 70, and so on.

The multilayer wiring structure 312 includes one or more layers of metal patterns 313 and a plurality of vias 314 connecting between the metal patterns 313 or between the metal film 318 and the metal pattern 313 in a thickness direction. The metal patterns 313 overlap a partial region of the second member 32 in a plan view. The metal pattern 313 disposed in a lowermost wiring layer is connected to the substrate 311 through the vias 314. The metal patterns 313 are not connected electrically to any of the circuit blocks in the first member 31. The metal film 318, the metal patterns 313, and the vias 314 function as a heat transfer path extending from the second member 32 to the substrate 311. The conductive protrusion 82 functions as not only a current path, but also a heat transfer path extending from the second member 32 to the module substrate.

Figure 4A:
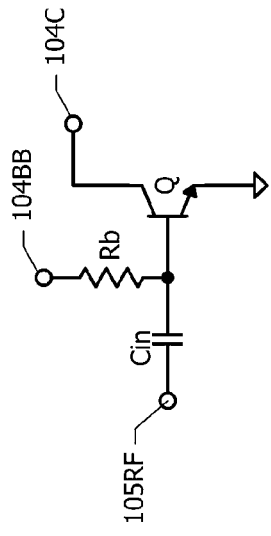
FIG. 4A is an equivalent circuit diagram for each of a plurality of cells forming a first amplifier circuit in the semiconductor device according to the first embodiment.

FIG. 4A is an equivalent circuit diagram for each of a plurality of cells forming the first amplifier circuit 51 (FIG. 1) in the semiconductor device according to the first embodiment. The first amplifier circuit 51 is constituted by the cells connected in parallel to each other. The second amplifier circuit 52 (FIG. 1) also has a similar circuit configuration to that of the first amplifier circuit 51. However, the number of cells forming the second amplifier circuit 52 is smaller than the number of cells forming the first amplifier circuit 51.

The cells each include a transistor Q, an input capacitor Cin, and a ballast resistance element Rb. A base of the transistor Q is connected to a radio-frequency signal input wiring 105RF through the input capacitor Cin. The base of the transistor Q is further connected to a base bias wiring 104BB through the ballast resistance element Rb. An emitter of the transistor Q is grounded. A collector of the transistor Q is connected to a collector wiring 104C. A supply voltage is applied to the collector of the transistor Q via the collector wiring 104C, and an amplified radio-frequency signal is output from the collector.

Figure 4B:
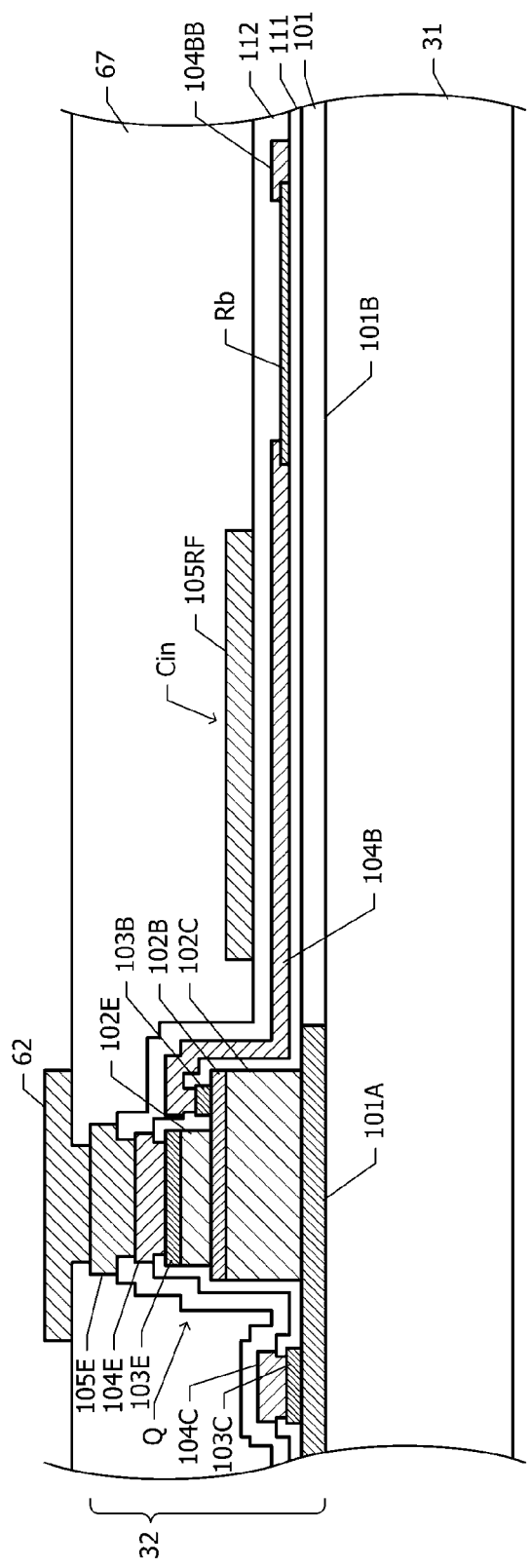
FIG. 4B is a schematic sectional view of one cell of the first amplifier circuit formed in a second member.

FIG. 4B is a schematic sectional view of one cell of the first amplifier circuit 51 (FIG. 1) formed in the second member 32. The second member 32 includes an underlying semiconductor layer 101. The underlying semiconductor layer 101 is in surface contact with the first member 31, whereby the second member 32 is joined to the first member 31. The underlying semiconductor layer 101 is divided into a conductive region 101A and an element isolation region 101B. For example, GaAs is used for the underlying semiconductor layer 101. The conductive region 101A is made of n-type GaAs, and the element isolation region 101B is formed by ion injection of an insulating impurity into an n-type GaAs layer.

The transistor Q is disposed on the conductive region 101A. The transistor Q includes a collector layer 102C, a base layer 102B, and an emitter layer 102E that are laminated in order starting from a side close to the conductive region 101A. The emitter layer 102E is disposed on a partial region of the base layer 102B. In one example, the collector layer 102C is made of n-type GaAs, the base layer 102B is made of p-type GaAs, and the emitter layer 102E is made of n-type InGaP. Thus, the transistor Q is a heterojunction bipolar transistor.

A base electrode 103B is disposed on the base layer 102B and is electrically connected to the base layer 102B. An emitter electrode 103E is disposed on the emitter layer 102E and is electrically connected to the emitter layer 102E. A collector electrode 103C is disposed on the conductive region 101A. The collector electrode 103C is electrically connected to the collector layer 102C via the conductive region 101A.

An interlayer insulating film 111 as a first insulating layer is disposed on the underlying semiconductor layer 101 to cover the transistor Q, the collector electrode 103C, the base electrode 103B, and the emitter electrode 103E. The interlayer insulating film 111 as the first insulating layer is made of an inorganic insulating material such as SiN, for example. A plurality of openings are formed in the interlayer insulating film 111 at predetermined positions.

An emitter wiring 104E, a base wiring 104B, the collector wiring 104C, and the base bias wiring 104BB each forming a first wiring layer are disposed on the interlayer insulating film 111. The ballast resistance element Rb is further disposed on the interlayer insulating film 111. The emitter wiring 104E passes through one opening formed in the interlayer insulating film 111 and is connected to the emitter electrode 103E. The base wiring 104B passes through another opening formed in the interlayer insulating film 111 and is connected to the base electrode 103B. The collector wiring 104C passes through still another opening formed in the interlayer insulating film 111 and is connected to the collector electrode 103C.

The base wiring 104B extends up to a region where the transistor Q is not disposed, and an extended end of the base wiring 104B overlaps one end portion of the ballast resistance element Rb. In the overlapping region therebetween, the base wiring 104B and the ballast resistance element Rb are electrically connected to each other. The other end portion of the ballast resistance element Rb overlaps the base bias wiring 104BB. In the overlapping region therebetween, the ballast resistance element Rb and the base bias wiring 104BB are electrically connected to each other.

An interlayer insulating film 112 as a second insulating layer is disposed on the interlayer insulating film 111 to cover the emitter wiring 104E, the base wiring 104B, the base bias wiring 104BB, and the ballast resistance element Rb each forming the first wiring layer. The interlayer insulating film 112 as the second insulating layer is also made of an inorganic insulating material such as SiN, for example.

An emitter wiring 105E and a radio-frequency signal input wiring 105RF each forming a second wiring layer are disposed on the interlayer insulating film 112. The emitter wiring 105E in the second wiring layer passes through an opening formed in the interlayer insulating film 112 and is connected to the emitter wiring 104E in the first wiring layer. Part of the radio-frequency signal input wiring 105RF overlaps the base wiring 104B in the first wiring layer in a plan view. In the overlapping region therebetween, the input capacitor Cin is formed.

The interlayer insulating film 67 as a third insulating layer is disposed to cover the emitter wiring 105E and the radio-frequency signal input wiring 105RF in the second wiring layer. The interlayer insulating film 67 as the third insulating layer is made of an organic insulating material such as polyimide, for example. As illustrated in FIG. 3, the interlayer insulating film 67 as the third insulating layer extends to cover the first member 31 as well.

The pad 62 is disposed on the interlayer insulating film 67 as the third insulating layer. The pad 62 passes through an opening formed in the interlayer insulating film 67 and is connected to the emitter wiring 105E in the second wiring layer.

Figure 5A:
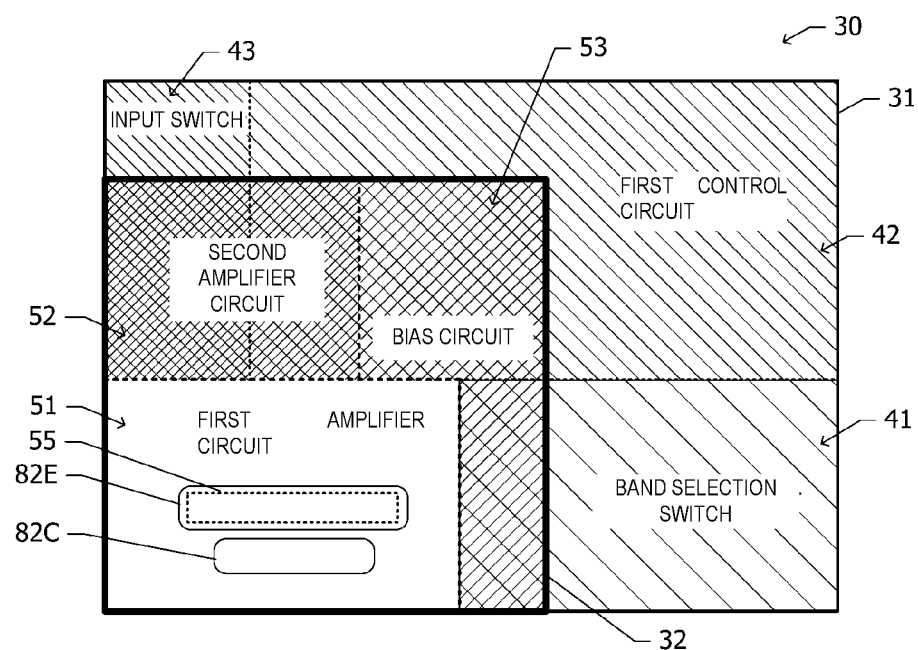
FIG. 5A is a schematic view illustrating an in-plane layout of circuit blocks when a first surface of the semiconductor device according to the first embodiment is viewed in plan.

FIG. 5A is a schematic view illustrating an in-plane layout of the circuit blocks when the first surface 31A of the semiconductor device 30 according to the first embodiment is viewed in plan. The band selection switch 41, the first control circuit 42, and the input switch 43 are included in the circuit blocks formed in the first member 31. When the first surface 31A is viewed in plan, those circuit blocks are disposed in an inner region of the first surface 31A.

The first amplifier circuit 51 in the final stage, the second amplifier circuit 52 in the first stage, and the bias circuit 53 are included in the circuit blocks formed in the second member 32. In FIG. 5A, the circuit blocks formed in the first member 31 are denoted by hatching with rightward declining lines. Regions where the second amplifier circuit 52 and the bias circuit 53 formed in the second member 32 are disposed are denoted by hatching with rightward rising lines. In FIGS. 8 to 13 as well, the circuit blocks are denoted by hatching in a similar manner.

Figure 5B:
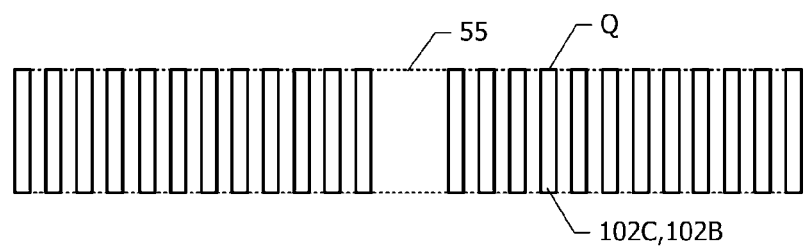
FIG. 5B illustrates a layout of a plurality of transistors forming the first amplifier circuit.

FIG. 5B illustrates a layout of the plurality of transistors Q (FIGS. 4A and 4B) forming the first amplifier circuit 51 in a plan view. The transistors Q each include the collector layer 102C and the base layer 102B. An outer peripheral line of the collector layer 102C and an outer peripheral line of the base layer 102B substantially match with each other in a plan view. The emitter layer 102E (FIG. 4B) is encompassed within the base layer 102B in a plan view. The transistors Q each have an elongate shape in one direction (up-down direction in FIG. 5B) in a plan view. Lengthwise directions of the transistors Q are parallel, and the transistors Q are disposed side by side in a direction (right-left direction in FIG. 5B) perpendicular to the lengthwise direction.

The transistors Q are distributed in a region 55. The region 55 where the transistors Q are distributed is defined, for example, as a minimum convex polygon encompassing the transistors Q in a plan view.

Transistor trains each made up of the plurality of transistors Q may be disposed in multiple rows in a direction perpendicular to the direction in which the transistors Q are arrayed. In such a case, a minimum convex polygon encompassing all the transistors Q belonging to the transistor trains may be defined as the region 55 where the transistors Q are distributed.

As illustrated in FIG. 5A, the region 55 where the transistors Q are distributed is positioned within the circuit block constituting the first amplifier circuit 51. Conductive protrusions 82E and 82C are connected respectively to emitters and collectors of the transistors Q. In a plan view, the conductive protrusion 82E for the emitters encompasses the region 55 where the transistors Q are distributed. The input capacitor Cin and the ballast resistance element Rb illustrated in FIGS. 4A and 4B are further disposed in the circuit block constituting the first amplifier circuit 51.

The first amplifier circuit 51 does not overlap any of the circuit blocks formed in the first member 31. Thus, the region 55 in which the transistors Q are distributed also does not overlap any of the circuit blocks formed in the first member 31. Furthermore, any of the transistors Q does not overlap any of the circuit blocks formed in the first member 31. The metal patterns 313, the vias 314, and the metal film 318 (FIG. 3) in the multilayer wiring structure 312 (FIG. 3) are disposed in a region of the first member 31, the region overlapping the circuit block constituting the first amplifier circuit 51 in a plan view.

The circuit blocks constituting the second amplifier circuit 52 and the bias circuit 53 overlap at least one of the circuit blocks formed in the first member 31. For example, the circuit block constituting the second amplifier circuit 52 overlaps the circuit blocks constituting the input switch 43 and the first control circuit 42 both formed in the first member 31, and the circuit block constituting the bias circuit 53 overlaps the circuit blocks constituting the first control circuit 42 and the band selection switch 41 both formed in the first member 31. Thus, one of the circuit blocks in the second member 32, the one circuit block not constituting the first amplifier circuit 51, may overlap over multiple ones of the circuit blocks in the first member 31. In another configuration, the above one circuit block may overlap one of the circuit blocks in the first member 31.

A method of fabricating the semiconductor device 30 according to the first embodiment will be described below with reference to FIGS. 6A to 7D. FIGS. 6A to 7C are sectional views of the semiconductor device 30 during a manufacturing process, and FIG. 7D is a sectional view of the finished semiconductor device 30.

Figure 6A:
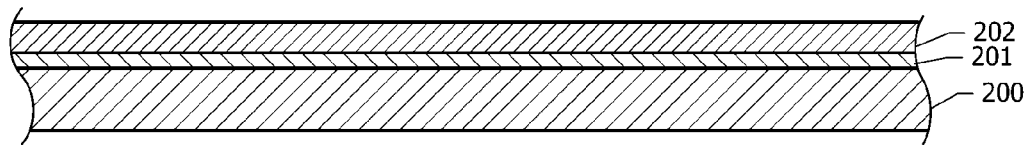
FIGS. 6A to 6F are sectional views of the semiconductor device during a manufacturing process.

As illustrated in FIG. 6A, a release layer 201 is epitaxially grown on a single-crystal base substrate 200 made of a compound semiconductor such as GaAs, and an element formation layer 202 is formed on the release layer 201. The transistors Q, the first wiring layer, the second wiring layer, and so on in the second member 32, illustrated in FIG. 4B, are formed in the element formation layer 202. Those circuit elements and wiring layers are formed in accordance with a general semiconductor process. FIG. 6A does not illustrate element structures formed in the element formation layer 202. In this stage, the element formation layer 202 is not yet separated for each second member 32.

Figure 6B:
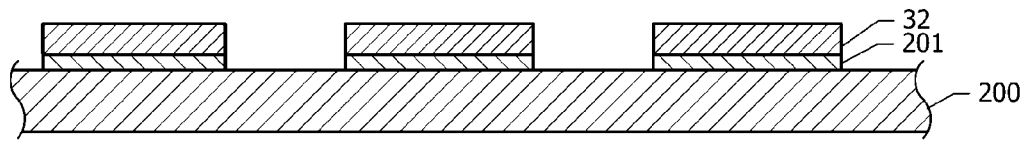

Next, as illustrated in FIG. 6B, the element formation layer 202 (FIG. 5A) and the release layer 201 are subjected to patterning by using a resist pattern (not illustrated) as an etch mask. In this stage, the element formation layer 202 is separated for each second member 32 (FIG. 5A).

Figure 6C:
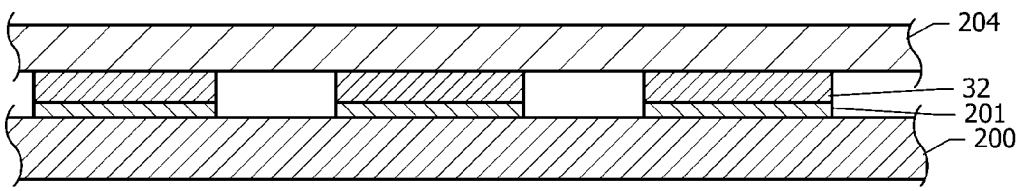

Next, as illustrated in FIG. 6C, a connecting support 204 is bonded on the separated second members 32. As a result, the individual second members 32 are connected to each other by the connecting support 204. The resist pattern used as the etch mask in the patterning step of FIG. 6B may be left such that the resist pattern exists between the second member 32 and the connecting support 204.

Figure 6D:
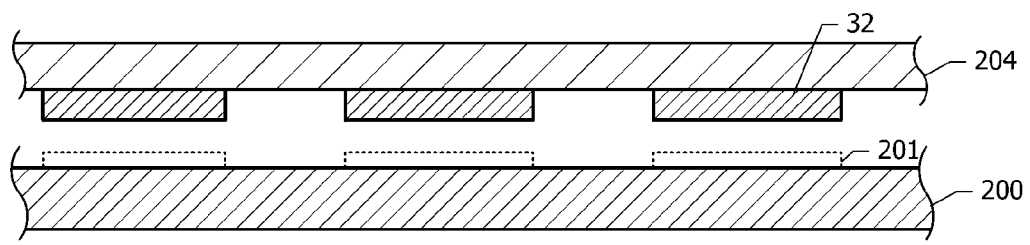

Next, as illustrated in FIG. 6D, the release layer 201 is selectively etched away with respect to the base substrate 200 and the second member 32. As a result, the second member 32 and the connecting support 204 are released from the base substrate 200. To selectively etch the release layer 201, the release layer 201 is formed of a compound semiconductor having an etch resistance different from the etch resistances of both the base substrate 200 and the second member 32.

Figure 6E:
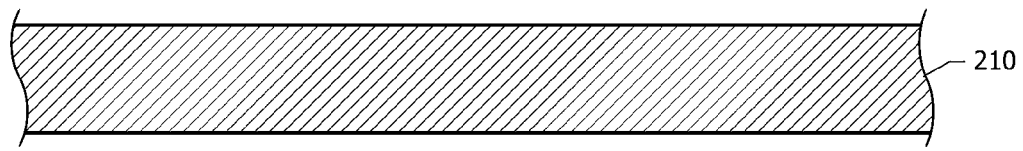

As illustrated in FIG. 6E, a substrate 210 is prepared which includes the input switch 43, the multilayer wiring structure 312 (FIG. 3), and so on that are to be disposed in the first member 31 (FIG. 3). In this stage, the substrate 210 is not yet separated for each first member 31.

Figure 6F:
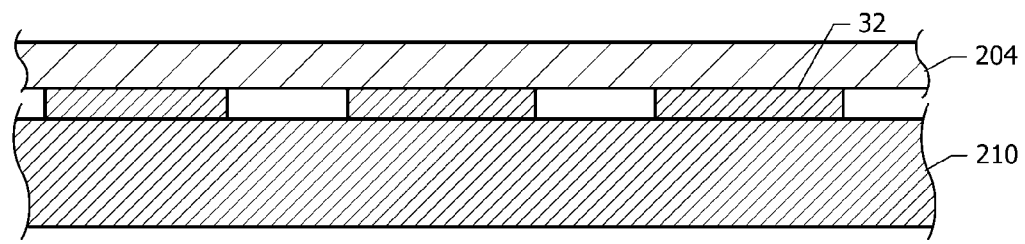

As illustrated in FIG. 6F, the second member 32 is joined to the substrate 210. Van der Waals bonding or hydrogen bonding is utilized to join the second member 32 and the substrate 210. Alternatively, the second member 32 may be joined to the substrate 210 by, for example, electrostatic force, covalent bonding, or eutectic alloy bonding. For example, when part of a surface of the substrate 210 is made of Au, the second member 32 and the substrate 210 may be joined to each other by bringing the second member 32 into close contact with an Au region and then applying pressure.

Figure 7A:
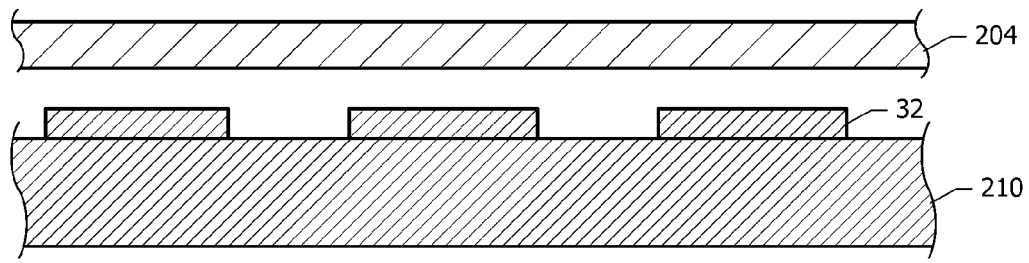
FIGS. 7A to 7C are sectional views of the semiconductor device during the manufacturing process.
Figure 7B:
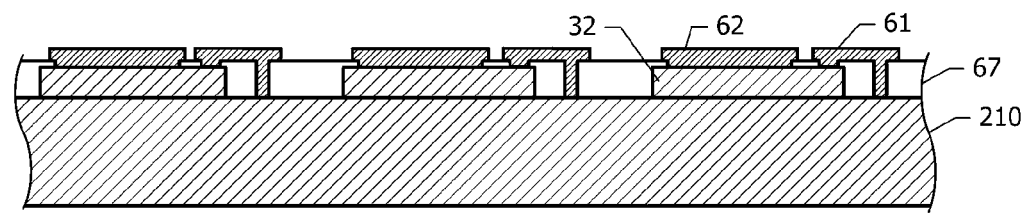

Next, as illustrated in FIG. 7A, the connecting support 204 is released from the second member 32. After releasing the connecting support 204, as illustrated in FIG. 7B, the interlayer insulating film 67 and the redistribution layer are formed over the substrate 210 and the second member 32. The redistribution layer includes, for example, the wiring 61 and the pads 62 and 63 (FIG. 3).

Figure 7C:
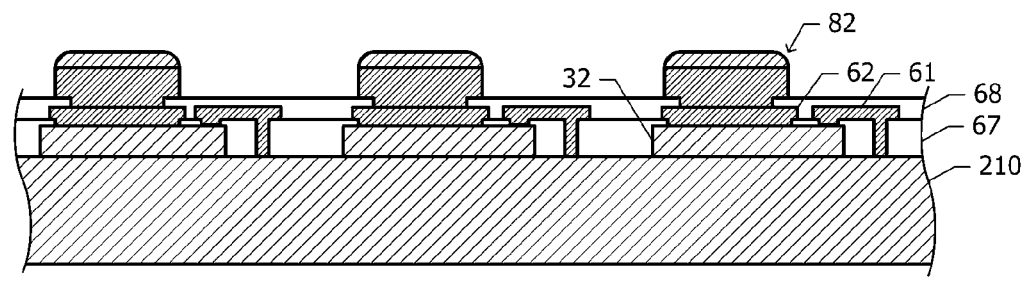
Figure 7D:
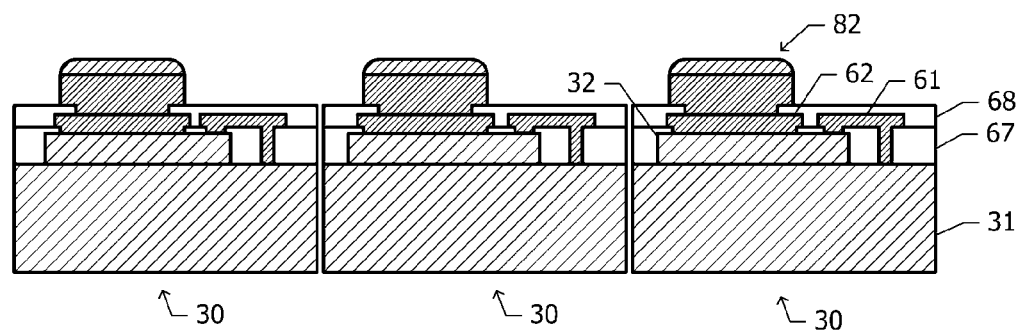
FIG. 7D is a sectional view of the finished semiconductor device.

Next, as illustrated in FIG. 7C, the protection film 68 is formed on the redistribution layer, and openings are formed in the protection film 68 at predetermined positions. Thereafter, the conductive protrusion 82 is formed in each of the openings and on the protection film 68. At the same time as forming the conductive protrusion 82, the other conductive protrusion 83 (FIG. 3) and so on are also formed.

Finally, as illustrated in FIG. 7D, the substrate 210 is cut with a dicing machine. As a result, the individual semiconductor devices 30 are obtained.

Advantageous effects of the first embodiment will be described below.

In the first embodiment, as illustrated in FIG. 3, the heat transfer path extending from the second member 32 to the first member 31 is formed. Since the second member 32 is in surface-contact with the first member 31, the second member 32 and the first member 31 are thermally coupled to each other with low thermal resistance. Furthermore, since the metal patterns 313 and the vias 314 are formed in the multilayer wiring structure 312 right under the second member 32, the thermal resistance of the transfer path from the second member 32 to the substrate 311 is lower than that when an entire region of the multilayer wiring structure 312 right under the second member 32 is made of an insulating material. Since the metal patterns 313 are not connected electrically to any of the circuit blocks in the first member 31, the metal patterns 313 functioning as the heat transfer path do not affect operations of the circuit blocks in the first member 31. The metal patterns 313 may be electrically connected to the ground conductor in the first member 31.

The heat transferred from the second member 32 to the first member 31 diffuses in the first member 31. The heat having diffused in the first member 31 is radiated to the outside from surfaces of the first member 31. When the semiconductor device 30 is covered with molding resin in a state of being mounted on the module substrate, the heat is transferred from the first member 31 to the molding resin.

Furthermore, the conductive protrusion 82 functions as the heat transfer path from the second member 32 to the module substrate. Thus, the heat is dissipated through two heat transfer paths, namely the heat transfer path extending from the second member 32 to the module substrate and the heat transfer path extending from the second member 32 to the first member 31. Therefore, the characteristics of heat dissipation from the second member 32 can be improved. To obtain a sufficient effect of improving the characteristics of heat dissipation, a semiconductor portion of the substrate 311 of the first member 31 is preferably made of a semiconductor, for example, an elemental semiconductor such as Si or Ge, with higher thermal conductivity than the compound semiconductor forming the semiconductor elements that are formed in the second member 32. Moreover, from the viewpoint of amplifying the radio-frequency signal, semiconductor elements made of a compound semiconductor with higher electron mobility than the semiconductor portion of the substrate 311 of the first member 31 are preferably used as the semiconductor elements formed in the second member 32.

Heat is more likely to generate in the region 55 (FIG. 5A) of the second member 32 where the transistors Q forming the first amplifier circuit 51 are distributed. To reduce the thermal resistance of the heat transfer path from the region 55 where the transistors Q are distributed to the substrate 311 (FIG. 3) of the first member 31, the metal patterns 313 (FIG. 3) are preferably disposed such that the region 55 where the transistors Q are distributed is encompassed within the contour of the metal patterns 313 in a plan view. Furthermore, the metal film 318 (FIG. 3) is preferably disposed such that the region 55 where the transistors Q are distributed is encompassed within the contour of the metal film 318 in a plan view.

Because a larger radio-frequency current flows in the first amplifier circuit 51 than in the second amplifier circuit 52 and the bias circuit 53, the first amplifier circuit 51 tends to become a source generating noise. According to the first embodiment, since the first amplifier circuit 51 (FIG. 5A) does not overlap any of the circuit blocks in the first member 31 in a plan view, the advantageous effect can be obtained in that the circuit blocks in the first member 31 are hard to be affected by the noise generated from the first amplifier circuit 51.

In addition, according to the first embodiment, the second amplifier circuit 52 and the bias circuit 53 (FIG. 5A) in the second member 32 each overlap at least one of the circuit blocks in the first member 31 in a plan view. Therefore, the size of the semiconductor device 30 in a plan view can be reduced.

A modification of the first embodiment will be described below.

Although, in the first embodiment, the heat transfer path formed by the metal film 318 (FIG. 3) and by the metal patterns 313 and the vias 314 (FIG. 3) both in the multilayer wiring structure 312 inside the first member 31 is in contact with the second member 32 and the substrate 311, the heat transfer path formed by the metal film 318, the metal patterns 313, and the vias 314 is not always needed to be in contact with the second member 32 and the substrate 311. For example, the heat transfer path formed by the metal patterns 313 and the vias 314 may be thermally coupled to each of the second member 32 and the substrate 311 with an insulating film interposed therebetween. In such a case, the insulating film functions as part of the heat transfer path from the second member 32 to the substrate 311. In another example, without forming the metal film 318, the first-member protection film 317 may be formed over the entirety of the first surface 31A. In such a case, a portion of the first-member protection film 317, the portion being in contact with the second member 32, mainly functions as the heat transfer path.

When the metal patterns 313 and the vias 314 are not disposed, the thermal resistance of the heat transfer path from the second member 32 to the substrate 311 increases. However, when satisfactory characteristics of heat dissipation from the first amplifier circuit 51 are obtained, the metal patterns 313 and the vias 314 does not always need to be disposed. In such a case, the insulating films included in the multilayer wiring structure 312 function as the heat transfer path.

Although the radio-frequency amplifier circuit 50 (FIG. 1) of the semiconductor device 30 according to the first embodiment is constituted in two stages formed by the second amplifier circuit 52 in the first stage and the first amplifier circuit 51 in the final stage, the radio-frequency amplifier circuit 50 may be constituted in three or more multiple stages. Also in such a case, the region 55 (FIG. 5A) where the transistors Q forming the first amplifier circuit 51 in the final stage are distributed is preferably disposed not to overlap any of the circuit blocks in the first member 31.

Although, in the first embodiment, the semiconductor device 30 is mounted on the radio-frequency module 20 (FIG. 1) adapted for the frequency division duplex (FDD) system, the semiconductor device 30 may be mounted on a radio-frequency module adapted for a time division duplex (TDD) system.

When the semiconductor device 30 is mounted on the radio-frequency module adapted for the TDD system, the band selection switch 41 may be replaced with a transmit-receive switch. The transmit-receive switch includes two contacts and one common terminal. One of the two contacts is connected to the first amplifier circuit 51 in the final stage through the output matching circuit 76 (FIG. 1). The other contact is connected to the low-noise amplifier 71 (FIG. 1) for amplifying the received signal or to the low-noise amplifier 71 through the band selection switch 73 (FIG. 1) for reception. The common terminal is connected to the antenna terminal through a filter. For example, like the band selection switch 41 (FIG. 5A) in the first embodiment, the transmit-receive switch overlaps the bias circuit 53 in the second member 32 in a plan view.

Second Embodiment

A semiconductor device according to a second embodiment will be described below with reference to FIG. 8. In the following, description of a configuration common to that of the semiconductor device according to the first embodiment described above with reference to FIGS. 1 to 7D is omitted.

Figure 8:
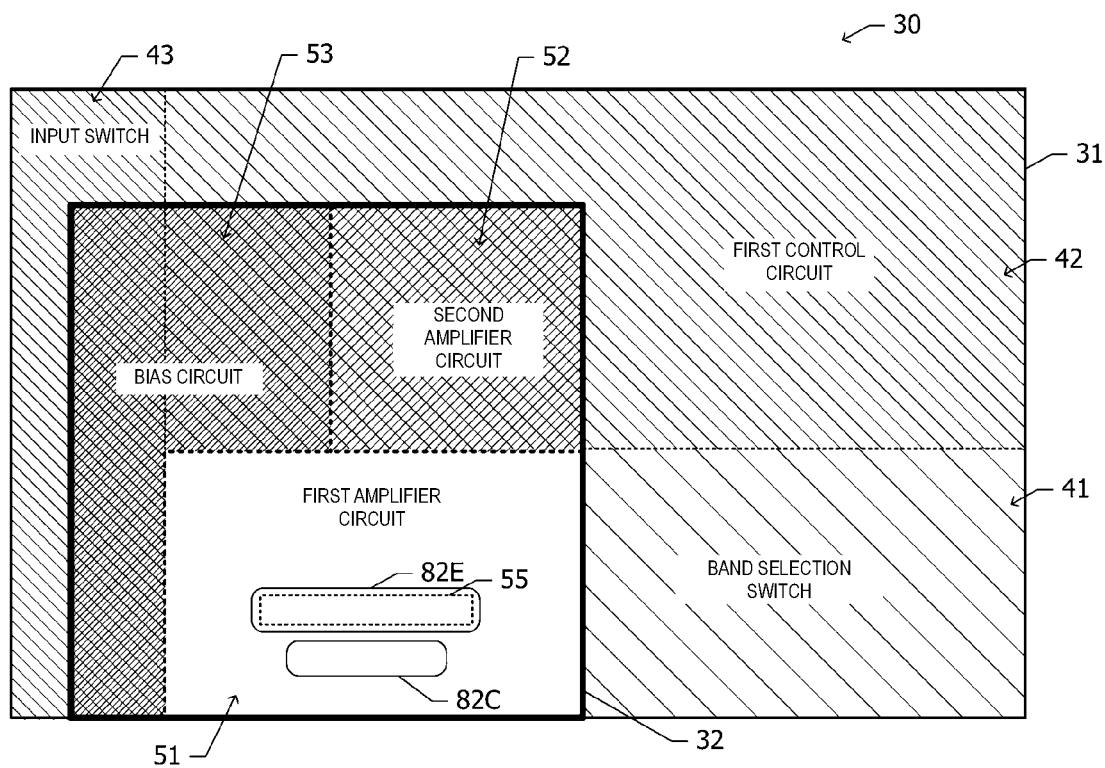
FIG. 8 is a schematic view illustrating an in-plane layout of circuit blocks of a semiconductor device according to a second embodiment.

FIG. 8 is a schematic view illustrating an in-plane layout of circuit blocks of the semiconductor device 30 according to the second embodiment. In the first embodiment (FIG. 5A), part of the circuit block constituting the band selection switch 41 in the first member 31 overlaps the second member 32 in a plan view. On the other hand, in the second embodiment, the circuit block constituting the band selection switch 41 does not overlap the second member 32 and is disposed outside the second member 32 in a plan view.

The circuit block constituting the bias circuit 53 in the second member 32 overlaps the circuit block constituting the input switch 43 and the circuit block constituting the first control circuit 42 both in the first member 31. The circuit block constituting the second amplifier circuit 52 in the second member 32 overlaps the circuit block constituting the first control circuit 42 in the first member 31.

Advantageous effects of the second embodiment will be described below.

As in the first embodiment, the second embodiment can also improve the characteristics of heat dissipation from the transistors Q of the first amplifier circuit 51. In addition, according to the second embodiment, an advantageous effect of more easily ensuring isolation between inputs and outputs because the circuit block constituting the band selection switch 41 does not overlap the second member 32 in a plan view. More specifically, the radio-frequency signal transferred through the band selection switch 41 is harder to couple to the input side of the radio-frequency amplifier circuit 50 (FIG. 1) through the second member 32. This results in an advantageous effect that oscillation of the radio-frequency amplifier circuit 50 is harder to occur.

A modification of the second embodiment will be described below. Although, in the second embodiment, the semiconductor device 30 is mounted on the radio-frequency module 20 adapted for the FDD system, the semiconductor device 30 may be mounted on a radio-frequency module adapted for the TDD system. When the semiconductor device 30 is mounted on the radio-frequency module adapted for the TDD system, the band selection switch 41 may be replaced with a transmit-receive switch. In such a case, preferably, a circuit block constituting the transmit-receive switch does not overlap the second member 32 and is disposed outside the second member 32 in a plan view.

Third Embodiment

A semiconductor device according to a third embodiment will be described below with reference to FIG. 9. In the following, description of a configuration common to that of the semiconductor device according to the second embodiment described above with reference to FIG. 8 is omitted.

Figure 9:
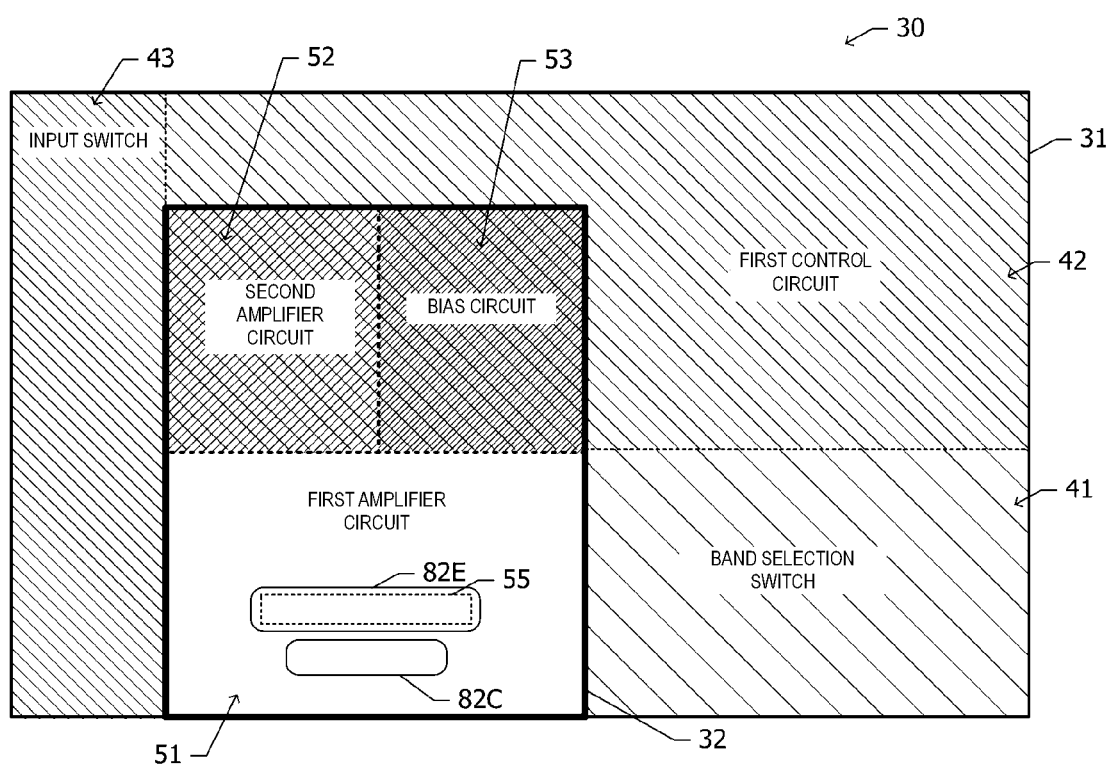
FIG. 9 is a schematic view illustrating an in-plane layout of circuit blocks of a semiconductor device according to a third embodiment.

FIG. 9 is a schematic view illustrating an in-plane layout of circuit blocks of the semiconductor device 30 according to the third embodiment. In the second embodiment (FIG. 8), the circuit block constituting the input switch 43 in the first member 31 overlaps the second member 32 in a plan view. On the other hand, in the third embodiment, the circuit block constituting the input switch 43 does not overlap the second member 32 in a plan view.

Advantageous effects of the third embodiment will be described below.

As in the second embodiment, the third embodiment can also improve the characteristics of heat dissipation from the transistors Q of the first amplifier circuit 51. In addition, according to the third embodiment, both the circuit blocks constituting the input switch 43 connected to the input side of the radio-frequency amplifier circuit 50 and the band selection switch 41 connected to the output side of the radio-frequency amplifier circuit 50 do not overlap the second member 32. As a result, the isolation between inputs and outputs to and from the radio-frequency amplifier circuit 50 can be further increased.

Fourth Embodiment

A semiconductor device according to a fourth embodiment will be described below with reference to FIG. 10. In the following, description of a configuration common to that of the semiconductor device according to the third embodiment described above with reference to FIG. 9 is omitted.

Figure 10:
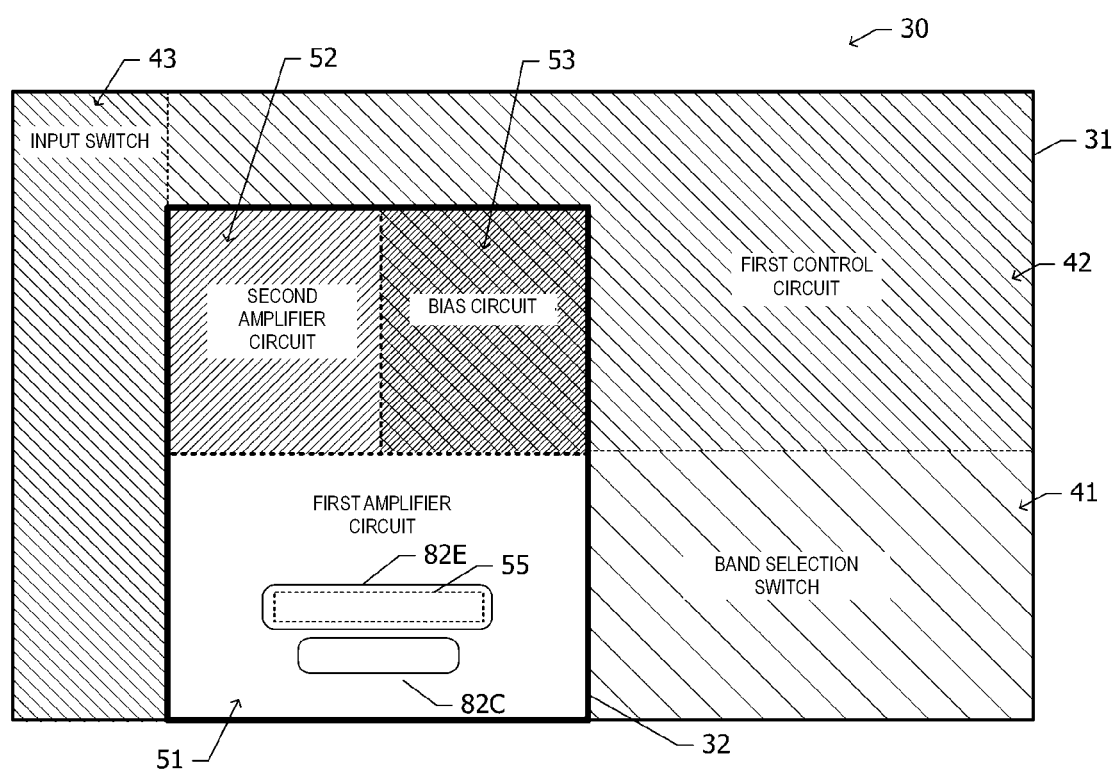
FIG. 10 is a schematic view illustrating an in-plane layout of circuit blocks of a semiconductor device according to a fourth embodiment.

FIG. 10 is a schematic view illustrating an in-plane layout of circuit blocks of the semiconductor device 30 according to the fourth embodiment. In the third embodiment, the circuit block constituting the second amplifier circuit 52 in the second member 32 overlaps the circuit block constituting the first control circuit 42 in the first member 31. On the other hand, in the fourth embodiment, the circuit block constituting the second amplifier circuit 52 in the second member 32 does not overlap any of the circuit blocks in the first member 31.

Advantageous effects of the fourth embodiment will be described below.

As in the third embodiment, the fourth embodiment can also improve the characteristics of heat dissipation from the transistors Q of the first amplifier circuit 51. In addition, according to the fourth embodiment, since the circuit block constituting the second amplifier circuit 52 in the second member 32 does not overlap any of the circuit blocks in the first member 31, influences of noise generated from the second amplifier circuit 52 upon the circuits formed in the first member 31 can be reduced.

Alternatively, a region where the transistors forming the second amplifier circuit 52 are distributed may be disposed not to overlap any of the circuit blocks in the first member 31, and the other region of the second amplifier circuit 52 may be disposed to overlap at least one of the circuit blocks in the first member 31. Even such a case can also improve the characteristics of heat dissipation from the transistors forming the second amplifier circuit 52.

Fifth Embodiment

A semiconductor device according to a fifth embodiment will be described below with reference to FIG. 11. In the following, description of a configuration common to that of the semiconductor device according to the fourth embodiment described above with reference to FIG. 10 is omitted.

Figure 11:
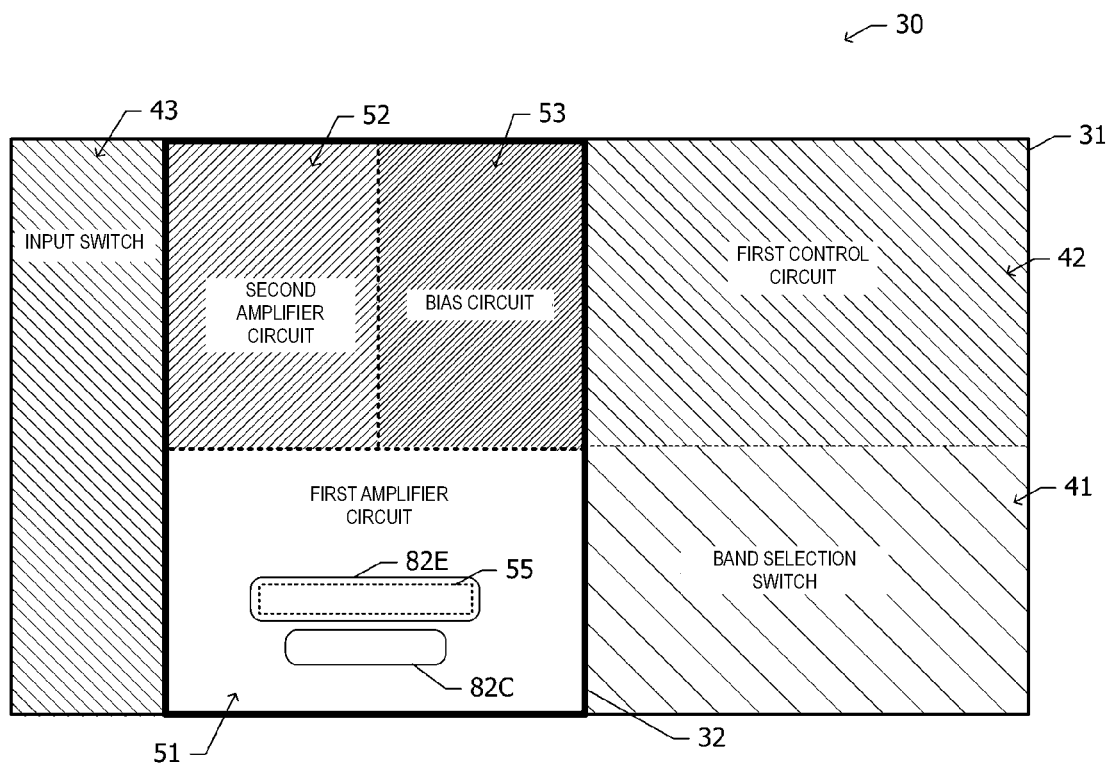
FIG. 11 is a schematic view illustrating an in-plane layout of circuit blocks of a semiconductor device according to a fifth embodiment.

FIG. 11 is a schematic view illustrating an in-plane layout of circuit blocks of the semiconductor device 30 according to the fifth embodiment. In the fourth embodiment (FIG. 10), in a plan view, the circuit blocks constituting the first amplifier circuit 51 and the second amplifier circuit 52 in the second member 32 do not overlap any of the circuit blocks in the first member 31, and the circuit block constituting the bias circuit 53 in the second member 32 overlaps the circuit block constituting the first control circuit 42 in the first member 31. On the other hand, in the fifth embodiment, any of the circuit blocks in the second member 32 does not overlap any of the circuit blocks in the first member 31 in a plan view. Stated in another way, any of the circuit blocks in the first member 31 does not overlap the second member 32 in a plan view.

Advantageous effects of the fifth embodiment will be described below.

As in the fourth embodiment, the fifth embodiment can also improve the characteristics of heat dissipation from the transistors Q of the first amplifier circuit 51. In addition, the fifth embodiment can provide an advantageous effect that the circuits formed in the first member 31 are hard to be affected by heat and noise generated from the second member 32. The first control circuit 42 in the first member 31 includes, for example, a charge pump producing a predetermined voltage. The charge pump of the first control circuit 42 and a digital circuit tend to become noise sources for analog circuits. Since the second member 32 does not overlap any of the circuit blocks in the first member 31, the fifth embodiment can further provide an advantageous effect that the circuits in the second member 32 are hard to be affected by the noise sources in the first member 31.

In the fifth embodiment, since the second member 32 does not overlap any of the circuit blocks in the first member 31, the size of the semiconductor device 30 in a plan view is larger than that of the semiconductor device 30 according to any of the first to fourth embodiments. Which one of the configurations according to the above-described embodiments is to be used as the semiconductor device 30 may be determined depending on a demanded level of noise suppression.

Sixth Embodiment

A semiconductor device according to a sixth embodiment will be described below with reference to FIG. 12. In the following, description of a configuration common to that of the semiconductor device according to the first embodiment described above with reference to FIGS. 1 to 7D is omitted.

Figure 12:
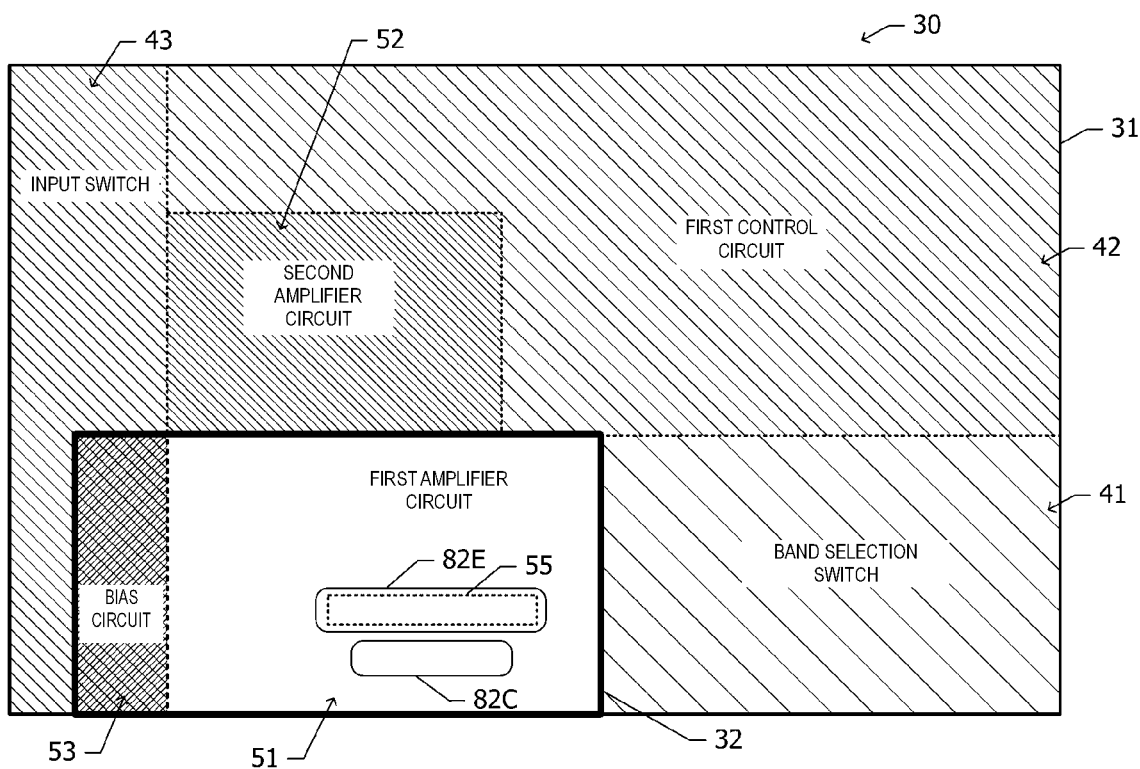
FIG. 12 is a schematic view illustrating an in-plane layout of circuit blocks of a semiconductor device according to a sixth embodiment.

FIG. 12 is a schematic view illustrating an in-plane layout of circuit blocks of the semiconductor device 30 according to the sixth embodiment. In the first embodiment (FIGS. 1, 5 and so on), the second amplifier circuit 52 in the first stage of the radio-frequency amplifier circuit 50 is formed in the second member 32. On the other hand, in the sixth embodiment, the second amplifier circuit 52 is formed in the first member 31 while the first amplifier circuit 51 and the bias circuit 53 are formed in the second member 32.

The circuit block constituting the bias circuit 53 in the second member 32 overlaps the circuit block constituting the input switch 43 in the first member 31 in a plan view. The circuit block constituting the first amplifier circuit 51 in the second member 32 does not overlap any of the circuit blocks formed in the first member 31 in a plan view.

Advantageous effects of the sixth embodiment will be described below.

As in the first embodiment, the sixth embodiment can also improve the characteristics of heat dissipation from the transistors Q of the first amplifier circuit 51. In addition, according to the sixth embodiment, since the second amplifier circuit 52 is formed in the first member 31, the size of the second member 32 can be reduced. Generally, a substrate made of an elemental semiconductor such as silicon, for example, is relatively inexpensive in comparison with a substrate made of a compound semiconductor such as GaAs, for example. Furthermore, the cost of a semiconductor manufacturing process for elemental semiconductors can be easily held lower than that of a semiconductor manufacturing process for compound semiconductors. According to the sixth embodiment, since the size of the second member 32 including the semiconductor elements made of the compound semiconductors is reduced, the cost of the semiconductor device 30 can be reduced.

Seventh Embodiment

A semiconductor device according to a seventh embodiment will be described below with reference to FIG. 13. In the following, description of a configuration common to that of the semiconductor device according to the sixth embodiment described above with reference to FIG. 12 is omitted.

Figure 13:
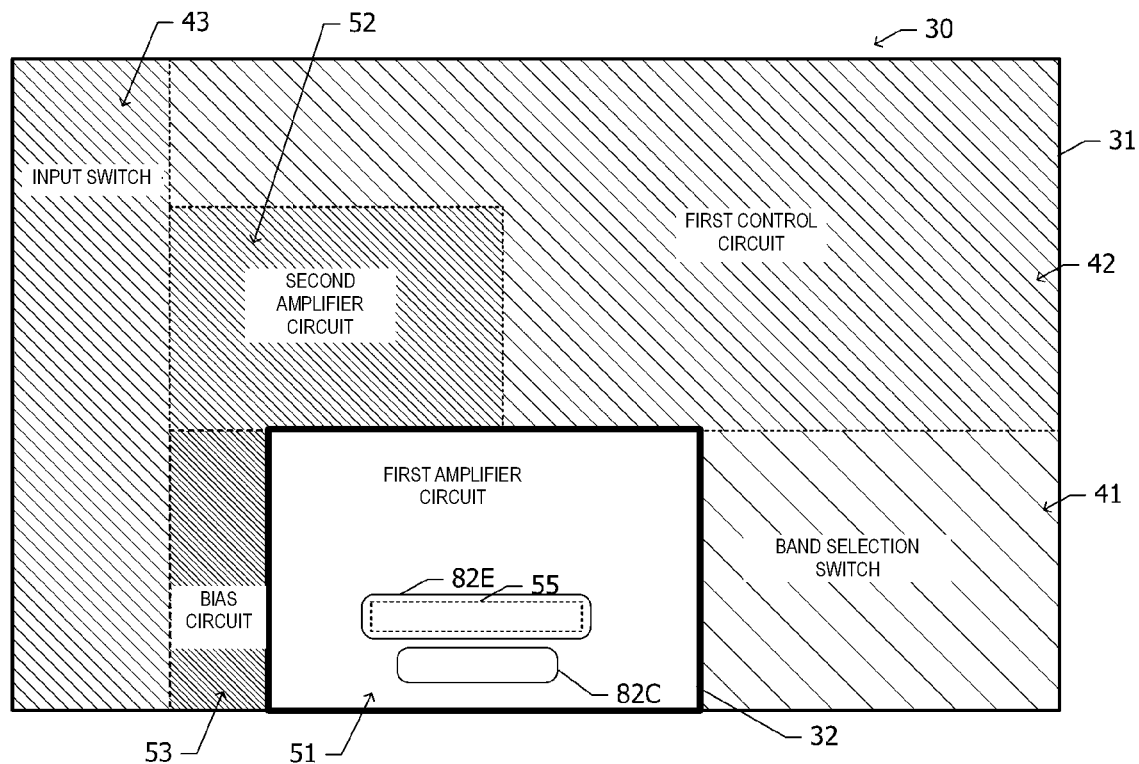
FIG. 13 is a schematic view illustrating an in-plane layout of circuit blocks of a semiconductor device according to a seventh embodiment.

FIG. 13 is a schematic view illustrating an in-plane layout of circuit blocks of the semiconductor device 30 according to the seventh embodiment. In the sixth embodiment, the second amplifier circuit 52 is formed in the first member 31 while the bias circuit 53 remains in the second member 32. On the other hand, in the seventh embodiment, the bias circuit 53 is also formed in the first member 31.

Advantageous effects of the seventh embodiment will be described below.

In the seventh embodiment, the second amplifier circuit 52 and the bias circuit 53 are both formed in the first member 31. Only the first amplifier circuit 51 in the final stage remains in the second member 32. According to the seventh embodiment, therefore, the size of the second member 32 can be made smaller than in the sixth embodiment. As a result, the cost of the semiconductor device 30 can be further reduced.

The above-described embodiments are merely illustrative and, as a matter of course, partial replacement and combination of the features described in the different embodiments can be implemented. Similar operations and advantageous effects with similar features in the different embodiments are not described for each of the embodiments. Furthermore, the present disclosure is not limited to the above-described embodiments. It is apparent to those skilled in the art that, for example, various variations, modifications, combinations, and so on are also conceivable.

What is claimed is:

1. A semiconductor device comprising:
    a first member having a first surface and including a plurality of circuit blocks disposed in an inner region of the first surface when the first surface is viewed in plan;
    a second member joined to the first surface of the first member in surface contact with the first surface, the second member including a plurality of first transistors that are connected in parallel to each other and configured as a first amplifier circuit, and the first transistors being disposed in a region without overlapping any of the circuit blocks in the first member in a plan view; and
    a conductive protrusion protruding from the second member on an opposite side to the first member.

2. The semiconductor device according to claim 1, wherein
    the second member overlaps at least one of the circuit blocks in the first member in a plan view.

3. The semiconductor device according to claim 1, wherein
    one of the circuit blocks in the first member constitutes a band selection switch configured to output a radio-frequency signal to one selected from a plurality of output contacts, the radio-frequency signal being output from the first amplifier circuit and input to one input contact of the band selection switch, and
    the circuit block constituting the band selection switch is disposed outside the second member in a plan view.

4. The semiconductor device according to claim 1, wherein
    one of the circuit blocks in the first member constitutes an input switch configured to input, to the first amplifier circuit, a radio-frequency signal input to one selected from a plurality of input contacts, and
    the circuit block constituting the input switch is disposed outside the second member in a plan view.

5. The semiconductor device according to claim 1, wherein
    the second member further includes at least one second transistor configuring as a second amplifier circuit that is connected to a stage preceding the first amplifier circuit, and the at least one second transistor is disposed in a region without overlapping any of the circuit blocks in the first member in a plan view.

6. The semiconductor device according to claim 1, wherein
one of the circuit blocks in the first member constitutes a second amplifier circuit that is connected to a stage preceding the first amplifier circuit, and
the second member includes a bias circuit configured to supply a bias current to the first amplifier circuit, the bias circuit overlapping at least one of the circuit blocks in the first member.

7. The semiconductor device according to claim 1, wherein
one of the circuit blocks in the first member constitutes a bias circuit configured to supply a bias current to the first amplifier circuit.

8. The semiconductor device according to claim 1, wherein
the second member is positioned without overlapping any of the circuit blocks in the first member in a plan view.

9. The semiconductor device according to claim 1, wherein
the first member includes a semiconductor substrate and a multilayer wiring structure disposed on one surface of the semiconductor substrate,
the first surface is the surface positioned on a side closer to the multilayer wiring structure, and
the multilayer wiring structure includes a metal pattern overlapping the second member in a plan view, the metal pattern being electrically unconnected from any of the circuit blocks.

10. The semiconductor device according to claim 2, wherein
one of the circuit blocks in the first member constitutes a band selection switch configured to output a radio-frequency signal to one selected from a plurality of output contacts, the radio-frequency signal being output from the first amplifier circuit and input to one input contact of the band selection switch, and
the circuit block constituting the band selection switch is disposed outside the second member in a plan view.

11. The semiconductor device according to claim 2, wherein
one of the circuit blocks in the first member constitutes an input switch configured to input, to the first amplifier circuit, a radio-frequency signal input to one selected from a plurality of input contacts, and
the circuit block constituting the input switch is disposed outside the second member in a plan view.

12. The semiconductor device according to claim 3, wherein
one of the circuit blocks in the first member constitutes an input switch configured to input, to the first amplifier circuit, a radio-frequency signal input to one selected from a plurality of input contacts, and
the circuit block constituting the input switch is disposed outside the second member in a plan view.

13. The semiconductor device according to claim 2, wherein
the second member further includes at least one second transistor configuring as a second amplifier circuit that is connected to a stage preceding the first amplifier circuit, and
the at least one second transistor is disposed in a region without overlapping any of the circuit blocks in the first member in a plan view.

14. The semiconductor device according to claim 3, wherein
the second member further includes at least one second transistor configuring as a second amplifier circuit that is connected to a stage preceding the first amplifier circuit, and
the at least one second transistor is disposed in a region without overlapping any of the circuit blocks in the first member in a plan view.

15. The semiconductor device according to claim 2, wherein
one of the circuit blocks in the first member constitutes a second amplifier circuit that is connected to a stage preceding the first amplifier circuit, and
the second member includes a bias circuit configured to supply a bias current to the first amplifier circuit, the bias circuit overlapping at least one of the circuit blocks in the first member.

16. The semiconductor device according to claim 3, wherein
one of the circuit blocks in the first member constitutes a second amplifier circuit that is connected to a stage preceding the first amplifier circuit, and
the second member includes a bias circuit configured to supply a bias current to the first amplifier circuit, the bias circuit overlapping at least one of the circuit blocks in the first member.

17. The semiconductor device according to claim 2, wherein
one of the circuit blocks in the first member constitutes a bias circuit configured to supply a bias current to the first amplifier circuit.

18. The semiconductor device according to claim 3, wherein
one of the circuit blocks in the first member constitutes a bias circuit configured to supply a bias current to the first amplifier circuit.

19. The semiconductor device according to claim 2, wherein
the first member includes a semiconductor substrate and a multilayer wiring structure disposed on one surface of the semiconductor substrate,
the first surface is the surface positioned on a side closer to the multilayer wiring structure, and
the multilayer wiring structure includes a metal pattern overlapping the second member in a plan view, the metal pattern being electrically unconnected from any of the circuit blocks.

20. The semiconductor device according to claim 3, wherein
the first member includes a semiconductor substrate and a multilayer wiring structure disposed on one surface of the semiconductor substrate,
the first surface is the surface positioned on a side closer to the multilayer wiring structure, and
the multilayer wiring structure includes a metal pattern overlapping the second member in a plan view, the metal pattern being electrically unconnected from any of the circuit blocks.

* * * * *